United States Patent

Kusano

[11] 4,167,650
[45] Sep. 11, 1979

[54] STEREO SIGNAL DEMODULATING CIRCUITS
[75] Inventor: Kazutoshi Kusano, Tokyo, Japan
[73] Assignee: Sansui Electric Co., Ltd., Tokyo, Japan
[21] Appl. No.: 872,932
[22] Filed: Jan. 27, 1978
[30] Foreign Application Priority Data
  Jan. 28, 1977 [JP] Japan .................................. 52-8377
[51] Int. Cl.$^2$ ............................................. H04H 5/00
[52] U.S. Cl. .................................. 179/1 GE; 329/50
[58] Field of Search ................... 179/15 BT, 1 GE; 325/36; 329/50, 167
[56] References Cited
U.S. PATENT DOCUMENTS
3,346,699 10/1967 Csicsatka ......................... 179/15 BT
4,074,075 2/1978 Ohsawa ............................ 179/15 BT Primary Examiner—Douglas W. Olms
Attorney, Agent, or Firm—Harris, Kern, Wallen & Tinsley

[57] ABSTRACT

A stereo signal demodulating circuit of a switching type is provided with a differential amplifier to obtain difference signals between two output signals from the switching circuit. The difference signals from the differential amplifier are added to the stereo composite signal to obtain the left (L) and right (R) audio signals. The beats between the harmonics of the switching signal and the sub-channel signal are removed at the differential amplifier without the use of SCA filter.

Two operational amplifiers may be used in place of the differential amplifier.

7 Claims, 3 Drawing Figures

STEREO SIGNAL DEMODULATING CIRCUITS

BACKGROUND OF THE INVENTION

This invention relates to a demodulating circuit for deriving a first signal and a second signal from a signal comprising a resultant signal of the first and second signals, a carrier-suppressed AM signal obtained by AM-modulating a carrier with a difference signal between the first and second signals, and a pilot signal, and in particular, to a demodulating circuit adaptable to demodulate a stereo signal including a Subsidiary Communication Authorization (SCA) signal.

In a known stereo broadcasting system for broadcasting both of the right and left side audio signals (which will be referred as R and L, respectively) by a broadcast wave, a main carrier is FM-modulated with a modulating signal comprising a main channel signal of (R+L), a sub-channel signal of a carrier-suppressed AM signal which is obtained by AM-modulating a sub-carrier (usually, 38 KHz) with a difference signal (R−L), and a pilot signal (usually, 19 KHz), and, then, is broadcasted. In the reception, the modulating signal is obtained by FM-demodulation of the received signal, from which the left side signal L and the right side signal R are separately derived at a demodulating circuit of the composite signal or, so called, a multiplex demodulator.

A known method for deriving the both signals R and L from the FM-demodulated signal is to apply a composite signal comprising at least the main channel and sub-channel signals to a switching circuit comprising two gates which are alternatingly switched on or off by a switching signal having the same frequency as the sub-carrier. The R and L signals are obtained at the outputs of the two gates, respectively. The switching signal is made from the pilot signal by the use of a phase-locked oscillator or a frequency doubler. The composite signal may include the pilot signal, which is removed at a de-emphasis circuit provided at a stage following the switching circuit. The pilot signal may be, in another way, removed before the switching circuit by a filter or the like. In that case, the composite signal does not include the pilot signal.

In some cases, an SCA signal is included in the stereo broadcast wave. The SCA signal is made by FM-modulating a secondary sub-carrier (usually, 67 KHz) with a certain signal, and is combined with the stereo modulating signal. The main carrier is FM-modulated with the resultant signal and is broadcasted. The SCA signal serves as a disturbance in the reception of the stereo broadcast.

In the demodulation of the above described switching type, beats between the SCA signal and harmonics of the switching signal are generated and are present at the demodulated output.

In order to remove such a disadvantage, a, so-called, SCA filter has been used for removing the SCA signal from the FM-demodulated signal. But, the use of the SCA filter badly affects the amplitude and the phase of the sub-channel signal, and, in practical use, cannot completely prevent the generation of such beats.

A demodulator circuit which resolves such a disadvantage is proposed in a Japanese patent application No. 37888/'71 which was laid open under a publication No. 3409/'73.

FIG. 1 shows a typical demodulator circuit proposed in the prior Japanese patent application.

Referring to FIG. 1, two outputs from the switching circuit SW are respectively applied to two inputs of a differential amplifier DA comprising transistors $Tr_1$ and $Tr_2$. Emitters of both transistors are commonly connected to a constant current circuit comprising a transistor $Tr_3$. The composite signal, which may or may not include the pilot signal, is applied to the base of the transistor $Tr_3$.

According to the circuit arrangement, even if the SCA signal accompanies the stereo signal, the beats between the SCA signal and the harmonics of the switching signal are suppressed at the differential amplifier DA because the beats present in the two outputs from the switching circuit SW are in-phase to one another. Furthermore, the composite signal is introduced to the differential amplifier DA through the transistor $Tr_3$, so that the signals R and L are obtained from output terminals $Out_R$ and $Out_L$ of the differential amplifier DA, respectively.

If the beat signals are represented by $E_B$, the two outputs from the switching circuit SW are represented as $(R+E_B+e_1)$ and $(L+E_B+e_2)$, respectively, where $e_1$ and $e_2$ represent high frequency components.

Assuming that the composite signal is represented by $(R+L)+(R-L)\cdot\sin \omega t + e_s + p\cdot\sin \omega/2t$ (where, $(R-L)\cdot\sin \omega t$ is the sub-channel signal, $e_s$ is the SCA signal, and $p\cdot\sin \omega/2t$ is the pilot signal), the outputs $e_R$ and $e_L$ of the differential amplifier DA are represented by following equations:

$$e_R = (R+E_B) - (L+E_B) + (R+L)$$

$$= (R-L) + (R+L)$$

$$= 2R$$

$$e_L = (L+E_B) - (R+E_B) + (R+L)$$

$$= (L-R) + (R+L)$$

$$= 2L$$

Namely, audio signals R and L are separately obtained from output terminals $Out_R$ and $Out_L$ of the differential amplifier DA. It should be noted that the high frequency components $e_1$, $e_2$, $(R-L)\cdot\sin \omega t$, $e_s$, and $p\cdot\sin \omega/2t$ are removed by de-emphasis circuits comprising a resistor $R_1$ and a capacitor $C_1$, and a resistor $R_2$ and a capacitor $C_2$.

The proposed circuit in the prior Japanese patent application enables to effectively remove the affection of SCA signal without the use of any SCA filter.

But, in the proposed circuit, the transistor $Tr_3$ amplifies the composite signal. And the amplified main channel signal $(R+L)$ is applied to the emitters of the transistors $Tr_1$ and $Tr_2$. Therefore, the main channel signal $(R+L)$ is considerably distorted because of the low impedances of the transistors $Tr_1$ and $Tr_2$ which are loads of the transistor $Tr_3$.

Furthermore, it is hard to balance the R and L output signals because of the characteristic difference of the transistors $Tr_1$ and $Tr_2$.

The use of diodes $D_1$–$D_4$ for the switching circuit causes the generation of a click noise at a time of the exchange between the monophonic broadcast and the stereo broadcast, because of the characteristic difference of diodes $D_1$–$D_4$.

SUMMARY OF THE INVENTION

It is a general object of this invention to provide a demodulator circuit for deriving a first signal and a second signal from a signal which comprises a resultant signal of the first and second signals, a carrier-suppressed AM signal which is obtained by AM-modulating the carrier by a difference signal between the first and second signal, and a pilot signal, with less distortion, with high separation and without any affection by any accompanied signal even if it is.

It is a specific object of this invention to provide a stereo signal demodulator circuit for deriving a right side audio signal (R) and a left side audio signal (L) from a stereo composite signal, wherein the disturbance by an SCA signal is effectively removed, even if the SCA signal accompanies the stereo composite signal, without the use of any SCA filter.

Another object of this invention is to provide such a demodulator circuit wherein the signals L and R are obtained with less distortion and with high L−R channel separation.

Still another object of this invention is to provide a demodulator circuit wherein the above described objects are realized with a simple circuit formation.

Another object of this invention is to provide a stereo demodulator circuit of a switching type wherein generation of a click noise at a time of the exchange between the monophonic broadcast and the stereo broadcast is prevented.

According to this invention, a demodulator circuit is obtained which is suitable for deriving right and left side audio signals R and L from a stereo composite signal which comprises a main channel signal of (R+L) and a sub-channel signal of a carrier-suppressed AM signal which is obtained by AM-modulating a sub-carrier with a difference signal (R−L).

The demodulator comprises first circuit means for making a switching signal having the same frequency as the sub-carrier, and second circuit means for sampling the composite signal by the switching signal to provide two output signals including the right and left side audio signals R and L, respectively. These two output signals are applied to third circuit means which provides two opposite phase difference signals between the two output signals from the second circuit means. Thus, even if an SCA signal accompanies the composite signal, any beats between the SCA signal and the harmonics of the switching signal can be cancelled at the third circuit means.

The two difference signals are applied to fourth and fifth circuit means respectively, each of which is for adding the input difference signal to the composite signal to obtain a corresponding one of the right and left side audio signals R and L.

The second circuit means may advantageously comprise two transmission lines coupled with the composite signal and two switching transistors connected between the respective transmission lines and the ground and being alternatingly turned on by the switching signal. The switching signal may advantageously be directly applied to bases of the two transistors in opposite phase to one another.

The second circuit may comprise two multiplier circuit means, to which the composite signal is applied, the switching signal being applied in opposite phase to one another.

As the third circuit means, a differential amplifier providing two opposite phase outputs is used. A pair of operational amplifiers may be used. Each of the operational amplifiers has two input terminals and an output terminal, and both amplifiers are so coupled with two outputs of the second circuit means that the outputs of both amplifiers are opposite to one another in phase.

As the fourth and fifth circuit means, variable resistors are used. The composite signal and a corresponding one of the two outputs from the third circuit means are coupled to opposite end terminals of the variable resistor. The added signal is obtained from a sliding terminal of the variable resistor.

Further objects and features of this invention will be understood from the following descriptions in connection with preferred embodiments of this invention referring to the drawings annexed hereto.

DETAILED DESCRIPTION OF THE PREFERRED EMBODIMENTS

Figure 2:
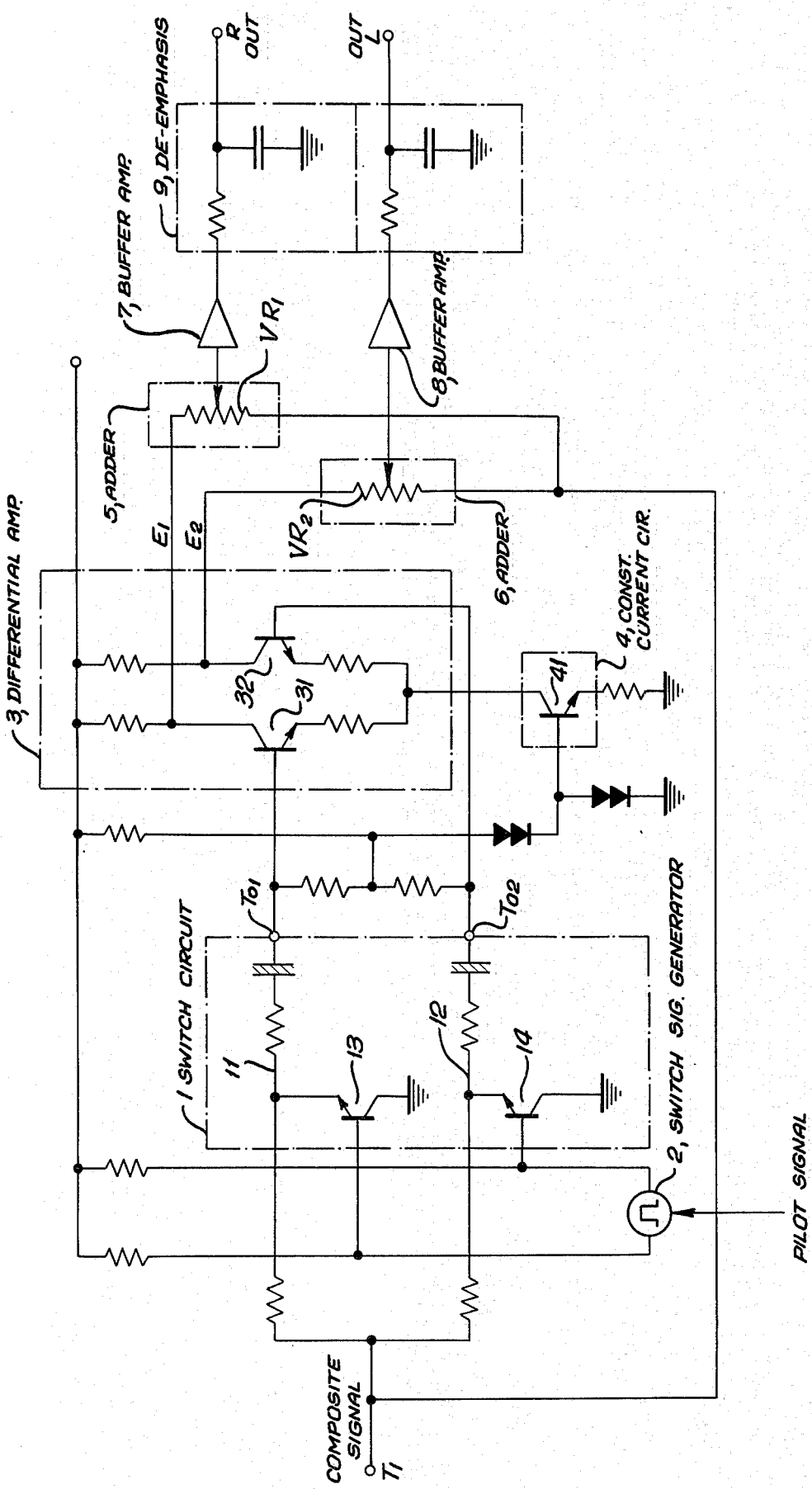
FIG. 2 illustrates a circuit diagram of an embodiment of this invention.

Referring to FIG. 2, an embodiment of this invention comprises a switching circuit 1 for sampling an input stereo composite signal by a switching signal from a switching signal generator 2. The composite signal comprises a main channel signal of a resultant signal (R+L) of a right side audio signal R and a left side audio signal L, and a sub-channel signal of a carrier-suppressed AM signal which is obtained by an AM-modulation of a sub-carrier with a difference signal (R−L) between the right and left side audio signals.

In a known stereo broadcast system, a pilot signal is combined with the main channel signal and the sub-channel signal. Therefore, in the received side, the FM-demodulated signal comprises the pilot signal in addition to the main channel signal and sub-channel signal. The pilot signal in the FM-demodulated signal is derived by a filter and is used for making the switching signal at the switching signal generator 2, as known in the prior art. The switching signal has the same frequency as the sub-carrier.

The FM-demodulated signal, or a signal that has the pilot signal removed from the FM-demodulated signal is applied to the switching circuit 1, as known in the prior art. Therefore, the above described composite signal may include the pilot signal.

Furthermore, as described hereinbefore, an SCA signal is, in a certain case, sent out together with a stereo signal. In that case, the FM-demodulated signal includes the SCA signal. The composite signal includes the SCA signal if the SCA signal is sent out together with the stereo signal.

Figure 1:
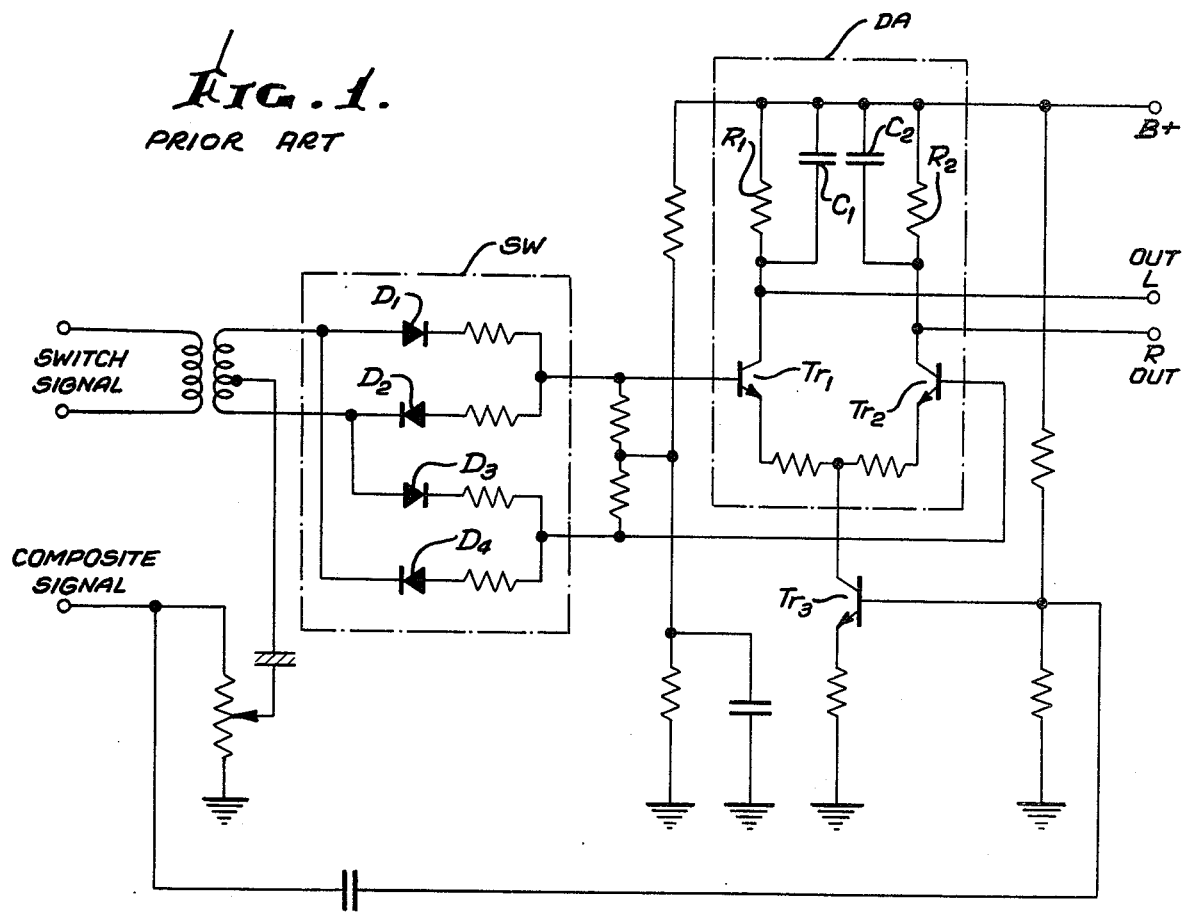
FIG. 1 illustrates a circuit diagram of a known stereo signal demodulator circuit.

The switching circuit 1 provides two outputs including the right side audio signal R and the left side audio signal L respectively, similar to the switching circuit as described hereinbefore in conjunction with FIG. 1.

The shown switching circuit 1 comprises two transmission lines 11 and 12 and two transistors 13 and 14 which are connected between the respective transmission lines and the ground. The transmission lines are commonly connected to an input terminal $T_1$ to which the composite signal is applied. The switching signal from the switching signal generator 2 is directly applied to bases of the transistors 13 and 14 which are alternatingly turned on. Thus, two outputs at output terminal $T_{o1}$ and $T_{o2}$ connected to the transmission lines 11 and 12 include the right and left side audio signals R and L, respectively.

In this switching circuit, since the sampling of the composite signal is effected by grounding both transmission lines alternatingly through the switching transistors, the generation of a clock noise at a time of the exchange between the monophonic broadcast and the stereo broadcast is prevented. The collectors of transistors 13 and 14 are advantageously grounded as shown. Alternatively, the emitters may be grounded.

The omission of a transformer for applying the composite signal and the switching signal to the switching circuit, as shown, is desirable because no phase distortion of the applied signals is caused.

The two outputs of the switching circuit 1 are applied to two input terminals of a differential amplifier 3. The differential amplifier 3 comprises two transistors 31 and 32. Emitters of transistors 31 and 32 are commonly connected to a constant current circuit 4 comprising a transistor 41. Two outputs are obtained from collectors of transistors 31 and 32.

Considering audio signal components, it will be noted that the outputs $E_1$ and $E_2$ from the differential amplifier 3 are represented by following equations:

$$E_1 = (R+E_B) - (L+E_B)$$

$$= R - L$$

$$E_2 = (L+E_B) - (R+E_B)$$

$$= L - R$$

where $E_B$ represents beats between the harmonics of the switching signal and the SCA signal included in the composite signal.

Two outputs from the differential amplifier 3 are applied to two adders 5 and 6, respectively, to be added the composite signal.

Considering audio signal components, the outputs $E_3$ and $E_4$ of two adders 5 and 6 are represented by following equations:

$$E_3 = E_1 + (R+L)$$

$$= R - L + R + L$$

$$= 2R$$

$$E_4 = E_2(R+L)$$

$$= L - R + R + L$$

$$= 2L$$

Thus, the right and left side audio signals can be obtained at outputs of the two adders 5 and 6, separately.

The outputs of the adders 5 and 6 are amplified at buffer amplifiers 7 and 8, respectively, and, then, applied to de-emphasis circuits 9 and 10, respectively, where high-frequency signal components are removed. Thus, the right and left audio signals R and L are obtained from output terminals $R_{out}$ and $L_{out}$ of the de-emphasis circuits 9 and 10.

In the shown embodiment, adders 5 and 6 are of variable resistors $VR_1$ and $VR_2$, respectively. One end terminal of each variable resistor is connected to a corresponding one of two outputs of the differential amplifier 3, and the other end terminal is coupled to the composite signal. The output of each adder is obtained from a sliding terminal of each variable resistor.

In the shown embodiment, beats between the harmonics of the switching signal and the SCA signal are cancelled at the differential amplifier 3, so that the use of any SCA filter is not necessary.

Since the right and left audio outputs are controlled by adjusting two variable resistors $VR_1$ and $VR_2$, both outputs are readily balanced.

Figure 3:
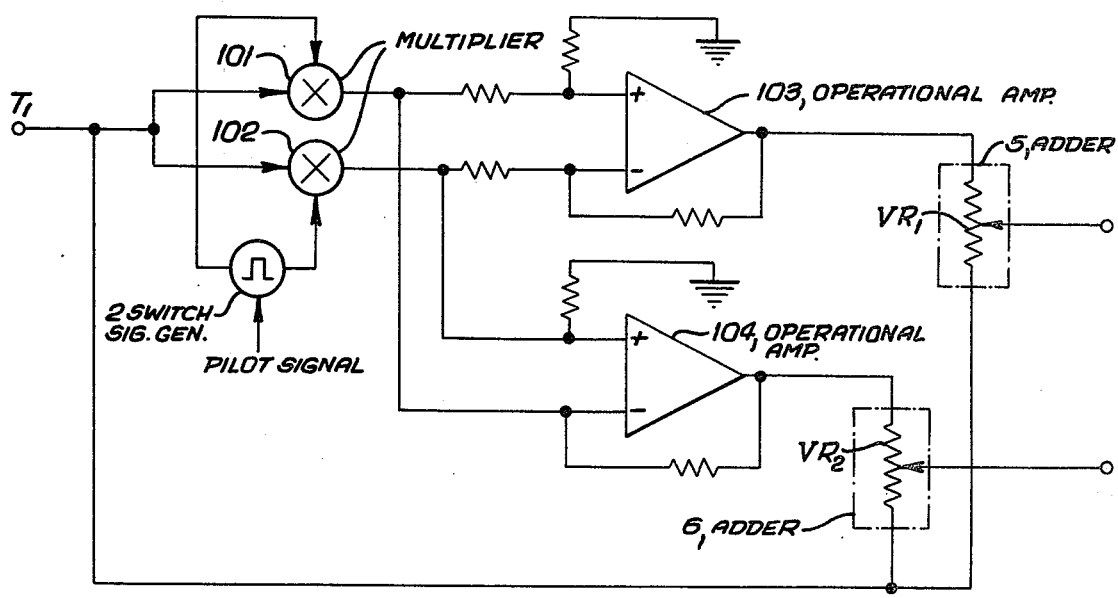
FIG. 3 illustrates another embodiment.

FIG. 3 shows another embodiment, which comprises two multipliers 101 and 102 which function similarly as the switching circuit 1 in FIG. 2, and two operational amplifiers 103 and 104 which function similarly as the differential amplifier 3 in FIG. 2.

The two multipliers 101 and 102 are commonly connected to an input terminal $T_1$ to which the composite signal is applied.

The switching signal from the switching signal generator 2 is applied to both of the multipliers 101 and 102, in opposite phase to one another.

It will be noted that the outputs of the two multipliers 101 and 102 include the right side audio signal R and left side audio signal L, respectively, similarly as the switching circuit 1 in FIG. 2.

The two outputs from the multipliers 101 and 102 are applied to both of two operational amplifiers 103 and 104. One of the two outputs is commonly coupled to + terminal of an operational amplifier 103 and − terminal of the other operational amplifier 104. And the other output is commonly coupled to − terminal of the operational amplifier 103 and + terminal of the operational amplifier 104. Therefore, it will be understood that outputs of the two operational amplifiers 103 and 104 are opposite phase difference signals between the outputs from the two multipliers 101 and 102, which include audio signal components (R−L) and (R−R), respectively, similarly as the two outputs from the differential amplifier 3 in FIG. 2. The beats between the harmonics of the switching signal and the SCA signal are cancelled.

The outputs from the two operational amplifiers 103 and 104 are respectively processed through adders 5 and 6, buffer amplifiers (not shown) and de-emphasis circuits (not shown) similarly as in FIG. 2, and the right side audio signal R and the left side audio signal L are obtained, separately.

This invention has been described in detail in conjunction with preferred embodiments, but it will be easily understood to those skilled in the art that those embodiments are for exemplification, and that other designations and various modifications are possible within the scope of this invention.

What is claimed is:

1. A demodulating circuit for deriving a first signal and a second signal from a composite signal comprising a resultant signal of the first and second signals, and a carrier-suppressed AM signal which is obtained by AM-modulation of a carrier with a difference signal of the first and second signals, which comprises:

first circuit means for making a switching signal having the same frequency as said carrier, second circuit means for sampling said composite signal by said switching signal to provide two output signals including said first and second signals, respectively, third circuit means for obtaining two difference signals between said two output signals from said second circuit means to provide a difference signal that the first signal is subtracted from the second signal and another difference signal that the second signal is subtracted from the first signal, fourth circuit means for adding one of said difference signals from said third circuit means to said composite signal to provide the first signal, said fourth circuit means comprising a variable resistor means having an end terminal connected to a corresponding one of said two outputs of said third circuit means, an opposite end terminal coupled with said composite signal, and a sliding terminal from which the first signal is obtained, and fifth circuit means for adding the other of said difference signals from said third circuit means to said composite signal to provide the second signal, said fifth circuit means comprising another variable resistor means having an end terminal connected to the other one of said two output of said third circuit means, an opposite end terminal coupled with said composite signal, and a sliding terminal from which the second signal is obtained.

2. A stereo signal demodulating circuit for deriving a right side audio signal (R) and a left side audio signal (L) from a composite signal comprising a main channel signal of a resultant signal (R+L) of said right and left side audio signals, and a sub-channel signal of a carrier-suppressed AM signal which is obtained by AM-modulation of a sub-carrier with a difference signal (R−L) of said right and left side audio signals, which comprises:

first circuit means for making a switching signal having the same frequency as said sub-carrier, second circuit means for sampling said composite signal by said switching signal to provide two output signals including said right and left side audio signals (R, L), respectively, third circuit means for obtaining two difference signals between said two output signals from said second circuit means to provide a difference signal (R−L) that said left side audio signal is subtracted from said right side audio signal and another difference signal (L−R) that said right side audio signal is subtracted from said left side audio signal, whereby any beat beteen the harmonics of said switching signal and a Subsidiary Communication Authorization (SCA) signal is cancelled even if the SCA signal is included in said composite signal, fourth circuit means for adding one (R−L) of said difference signals from said third circuit means to said composite signal to provide said right side audio signal, said fourth circuit means comprising a variable resistor means having a end terminal connected to a corresponding one of said two outputs of said third circuit means, an opposite end terminal coupled with said composite signal, and a sliding terminal from which the right side audio signal is obtained, and fifth circuit means for adding the other (L−R) of said difference signals from said third circuit means to said composite signal to provide said left side audio signal, said fifth circuit means comprising another variable resistor means having an end terminal connected to the other one of said two output of said third circuit means, an opposite end terminal coupled with said composite signal, and a sliding terminal from which the left side audio signal is obtained.

3. The stereo signal demodulating circuit as claimed in claim 2, wherein said third circuit means is a differential amplifier circuit having two input terminals which are respectively coupled to said two outputs from said second circuit means, and having two output terminals to provide said two difference signals.

4. The stereo signal demodulating circuit as claimed in claim 3, wherein said second circuit means comprises two transmission lines coupled with said composite signal, and two switching transistor means connected between the respective transmission lines and the ground and being alternatingly turned on by the switching signal from said first circuit means.

5. The stereo signal demodulating circuit as claimed in claim 4, wherein the switching signal is directly applied to respective bases of said transistors with opposite phases to one another.

6. The stereo signal demodulating circuit as claimed in claim 2, wherein said third circuit means comprises two operational amplifier means, to each of which said two output signals from said second circuit means are applied, one of the two operational amplifier means providing the difference signal (R−L), and the other providing the other difference signal (L−R).

7. The stereo signal demodulating circuit as claimed in claim 6, wherein said second circuit means comprises two multiplier circuit means to which the composite signal is applied, the switching signal being applied to said two multiplier means in opposite phase to one another.

* * * * *